United States Patent [19]

Jung

[11] Patent Number: 5,488,239
[45] Date of Patent: Jan. 30, 1996

[54] SOLID STATE IMAGE SENSOR WITH SHAPED PHOTODIODES

[75] Inventor: Hun J. Jung, Seoul, Rep. of Korea

[73] Assignee: Goldstar Electron Co., Ltd., Rep. of Korea

[21] Appl. No.: 275,908

[22] Filed: Jul. 14, 1994

[51] Int. Cl.⁶ .............................. H01L 27/14; H01L 31/00
[52] U.S. Cl. ........................ 257/231; 257/232; 257/233; 257/448; 257/432
[58] Field of Search ..................................... 257/231, 232, 257/233, 294, 432, 435, 448, 443

[56] References Cited

U.S. PATENT DOCUMENTS

| | | | |
|---|---|---|---|
| 4,602,289 | 7/1986 | Sekine | 257/233 X |
| 5,274,476 | 12/1993 | Lee | 257/233 X |
| 5,306,906 | 4/1994 | Aoki et al. | 257/233 X |

FOREIGN PATENT DOCUMENTS

| | | | |
|---|---|---|---|
| 58-88976 | 5/1983 | Japan | 257/233 |
| 60-187187 | 9/1985 | Japan | 257/233 |

OTHER PUBLICATIONS

Mizouchi et al, "⅓-Inch 360 Kpixel IT-CCD Image Sensor," The Journal of the Institute of Television Engineers of Japan, vol. 47, No. 2, 1993, pp. 197–202.

*Primary Examiner*—William Mintel
*Attorney, Agent, or Firm*—Poms, Smith, Lande & Rose

[57] ABSTRACT

A solid state image sensor including (a) a plurality of photodiodes arranged such that the photodiodes in odd number columns and the photodiodes in even number columns straddle each other, for generating image signal charges by converting light signals into electrical signals, (b) vertical charge coupled devices each formed between the photodiode columns for vertically transmitting the image signal charges generated in each of the photodiodes, and (c) a plurality of microlenses each arranged matched with each of the plurality of photodiodes over each of the photodiodes. Each of the photodiodes is shaped like a peanut shell having a narrower middle part. The photodiodes shape is thereby matched to the focusing shape of each matching microlens, optimizing the cell layout efficiency.

2 Claims, 4 Drawing Sheets

SOLID STATE IMAGE SENSOR WITH SHAPED PHOTODIODES

FIELD OF THE INVENTION

This invention relates to a solid state image sensor, more particularly to a solid state image sensor each photodiode of which is shaped like a peanut shell in plan view at the light reception part thereof to match a light reception shape of a microlens in order to optimize cell layout, and charge coupled devices arranged in zigzag in order to improve light reception efficiency.

BACKGROUND OF THE INVENTION

A common solid state image sensor includes, as shown in FIG. 1, a construction having a plurality of photodiodes PD 10 arranged in the form of a matrix for generating image signal charges by converting light signals into electric signals, vertical charge coupled devices VCCD 12 each of which is arranged between each column of photodiodes PD 10 for transmitting the image signal charges generated in the photodiodes PD vertically, a horizontal charge coupled device HCCD 14 formed at one end of the vertical charge coupled devices for transmitting the image signal charges transmitted from the vertical charge coupled devices VCCD horizontally, and a sensing amplifier 16 formed at one end of the horizontal charge coupled device for sensing the transmitted image signal charges and transmitting them to outside in electric signals. Optical metal is formed on the foregoing construction. Also shown in FIG. 1 are the output 18, optical block area 20, image sensing area 22, and a unit cell 24.

A conventional solid state image sensor having the foregoing construction is explained in more detail hereinafter, referring to the attached drawings, wherein FIG. 2 is a layout of a unit cell of a conventional solid state image sensor; FIG. 3 is a section of a unit cell of a conventional solid state image sensor; and FIG. 4 shows an arrangement of the photodiodes and the vertical charge coupled devices of a conventional solid state image sensor.

First, as shown in FIG. 2, a unit cell of a conventional solid state image sensor includes a photodiode PD 28 and a vertical charge coupled device VCCD 30 having a fixed distance between them, a channel stop layer 32 formed around the photodiode PD except a part between the photodiode PD and the vertical charge coupled device VCCD, a first polygate 34 and a second polygate 36 for transmitting image signals from the photodiode PD to the vertical charge coupled device VCCD and in vertical direction within the vertical charge coupled device, and optical metal 38 for allowing only the photodiode PD to be irradiated. Herein, a transfer gate TG transmitting image signals from the photodiode to the vertical charge coupled device VCCD is the second polygate 36.

The sectional construction of the unit cell having the foregoing layout is as shown in FIG. 3. That is, the unit cell includes a p-type well 40 formed on an n-type semiconductor substrate 42, the photodiode PD and the vertical charge coupled device VCCD formed within the p-type well by forming an n-type impurity diffusion layer at a certain distance, a gate insulation film 44 deposited all over the surface, a polygate 46 formed over the vertical charge coupled device VCCD, an insulation film 48 deposited all over the surface, optical metal 50 (38) formed on all parts except the photodiode PD, and a color filter layer 52 and a microlens 54 formed over the photodiode. P-type material layer is shown by 55, 56 and N-type by 57, 58.

FIG. 4 shows a layout of photodiodes 60 and vertical charge coupled devices 62 of a conventional solid state image sensor, and FIG. 5 shows a layout of microlenses 70 of a conventional solid state image sensor, wherein each of the photodiodes has a rectangular shape in plan view and each of the microlenses over the photodiode PD has an oval shape. That is, since each of the photodiodes PD has a rectangular shape and the photodiodes are arranged in matrix, each of the microlenses formed over each of the photodiodes PD also has an oval shape and the microlenses are arranged in matrix, accordingly.

Operation of a conventional solid state image sensor having the foregoing construction is as follows.

Since the optical metal layer 38 shields light except from the photodiodes, light, focused by the microlenses, irradiates only onto the photodiodes. And the photodiodes PD generate image signal charges according to the quantity of light directed thereto. In this instance, the image signal charges generated in the photodiodes PD are transmitted to the vertical charge coupled devices VCCD through the first and the second polygates and by trigger voltage applied thereto, from each of the vertical charge coupled devices to the horizontal charge coupled device by clock signals $V\phi1$ to $V\phi4$, 74, 76, 78, 80 applied to the first and the second polygates, from the horizontal charge coupled device to output terminal by clock signals $H\phi1$ to $H\phi2$ and therefrom to outside in electric signals by the sensing amplifier at the output terminal.

However, the foregoing conventional solid state image sensor has the following problems.

First, the photodiodes PD have rectangular shapes and are arranged in a matrix, and the microlenses also are arranged in a matrix over each of the photodiodes, accordingly. Therefore, as shown in FIG. 5, even though the microlenses are arranged with a fixed space 84 between them, an empty space 86 formed by four adjacent microlenses occupies a relatively large space causing a drop in light receiving efficiency. Also, the shape of a photodiode is rectangular, and the shape of a microlens is oval. But its focusing shape is not rectangular. That is, as shown in FIG. 6, the shape of focusing of a microlens is like a peanut shell as has been published in the paper "⅓ inch 360K pixel IT-CCD Image Sensor, TO Institute, 1993, pages 192–200." Therefore, due to the difference of shape of light reception of a photodiode and the shape of focusing of a microlens, the efficiency of the cell layout drops.

SUMMARY OF THE INVENTION

The objects of this invention devised for solving the foregoing problems lie in improving light reception efficiency by shaping a light reception part of a photodiode like a peanut shell, and arranging vertical charge coupled devices in a zigzag.

These and other objects and features of this invention can be achieved by providing a solid state image sensor including a plurality of photodiodes arranged such that the photodiodes in odd number columns and the photodiodes in even number columns straddle each other, for generating image signal charges by converting light signals into electrical signals, vertical charge coupled devices each formed between the photodiode columns for transmitting the image signal charges generated in each of the photodiodes vertically, and a plurality of microlenses each arranged matched

DETAILED DESCRIPTION OF THE INVENTION

This invention is to be explained in detail hereinafter, referring to the attached drawings.

Figure 7:
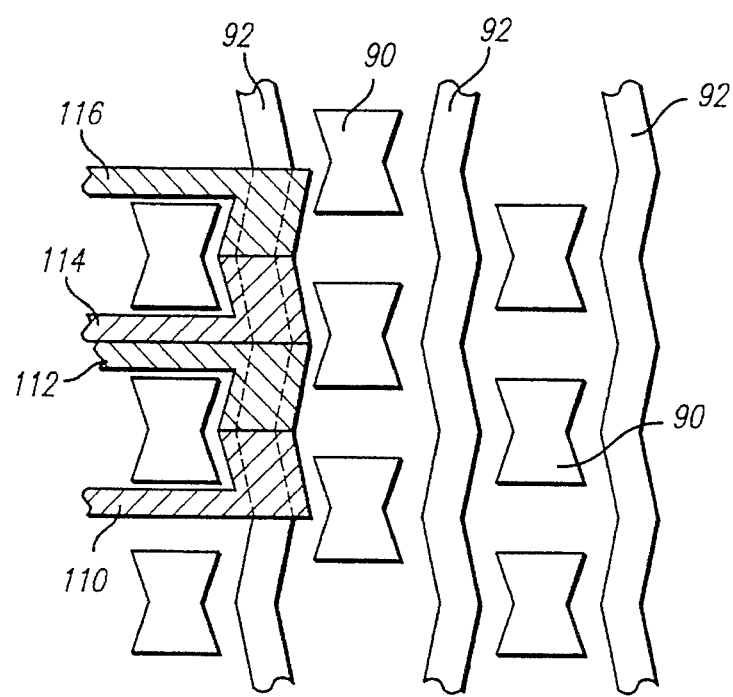
FIG. 7 is an arrangement of photodiodes 90 and vertical charge coupled devices 92 of a solid state image sensor in accordance with this invention.
Figure 8:
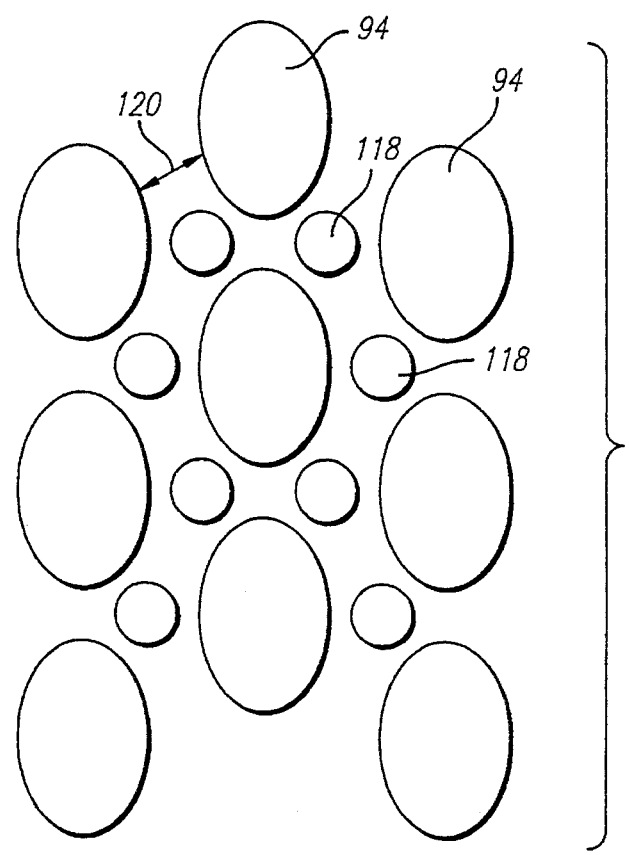
FIG. 8 is an arrangement of microlenses 94 of a solid state image sensor in accordance with this invention.

Shown in FIG. 7 is an arrangement of photodiodes and vertical charge coupled devices of a solid state image sensor in accordance with this invention, and FIG. 8 shows an arrangement of microlenses 94 of a solid state image sensor in accordance with this invention.

Figure 1:
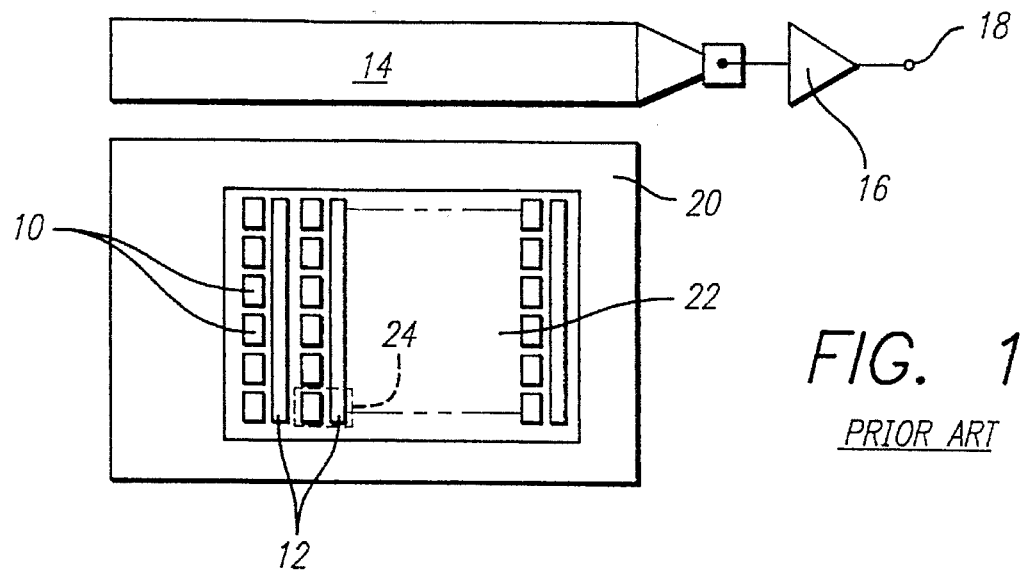
FIG. 1 is a common layout of a solid state image sensor.
Figure 2:
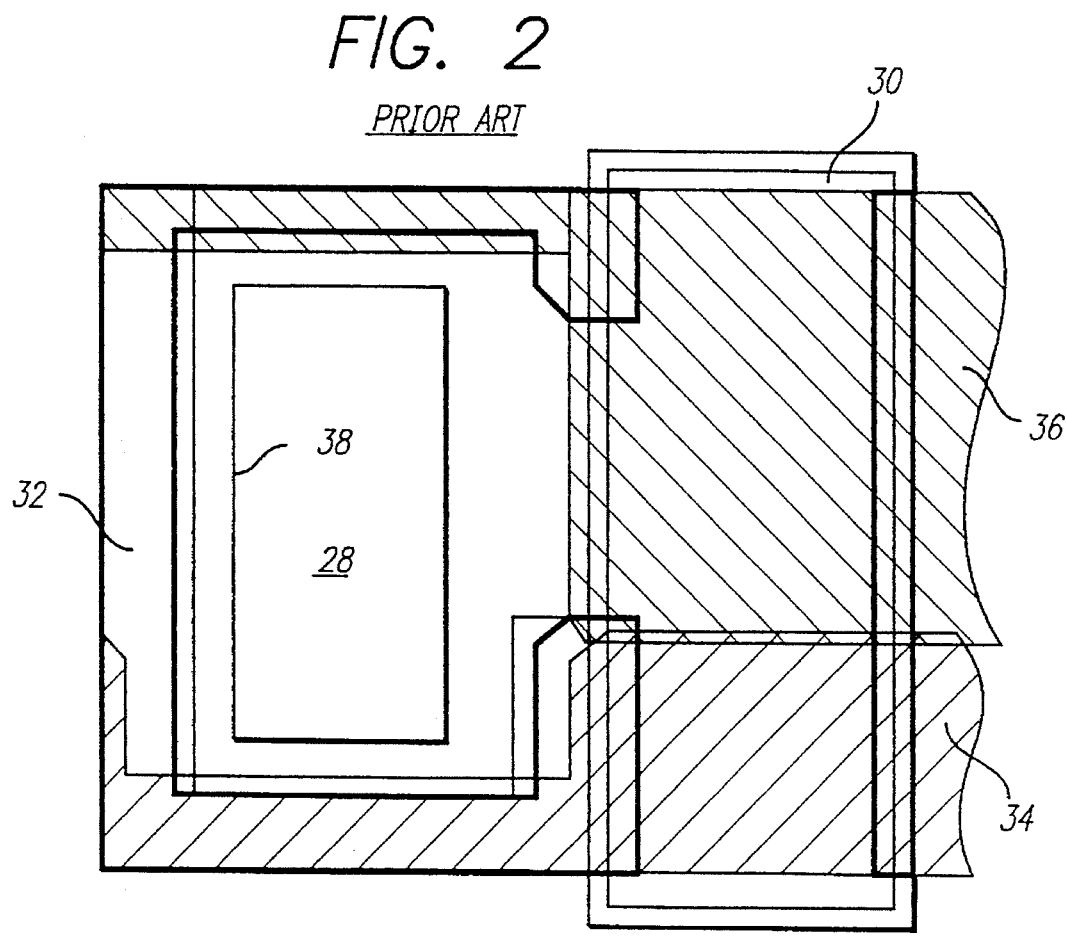
FIG. 2 is a layout of a unit cell of a conventional solid state image sensor.
Figure 3:
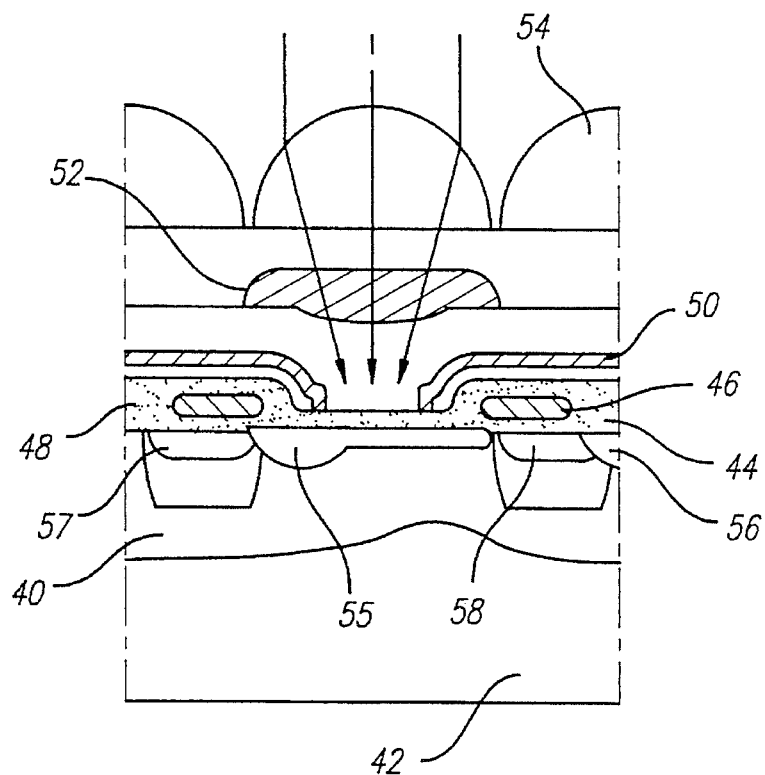
FIG. 3 is a section of a unit cell of a conventional solid state image sensor.
Figure 4:
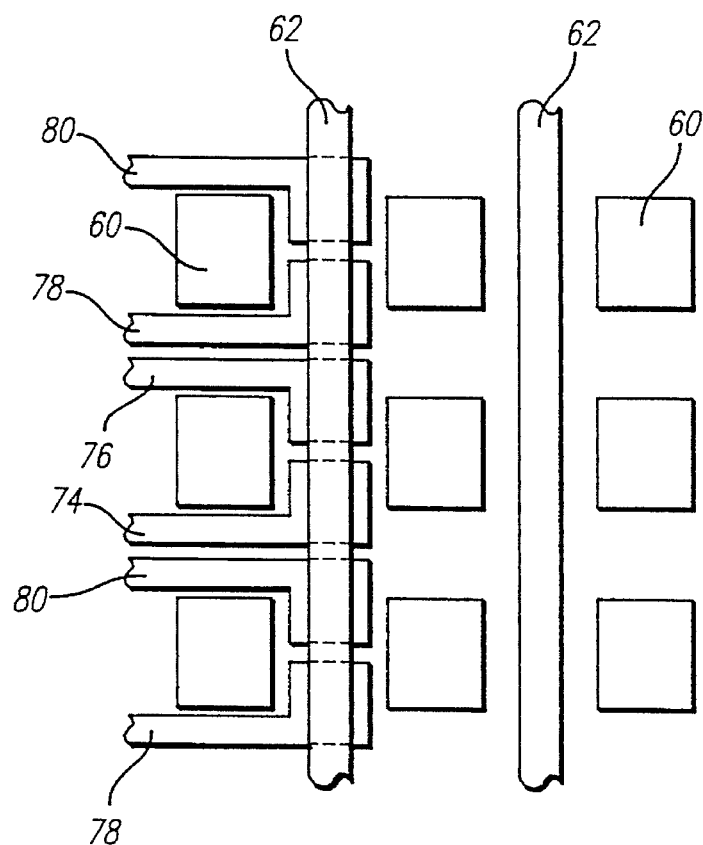
FIG. 4 is an arrangement of a photodiode charge coupled device of a conventional solid state image sensor.
Figure 5:
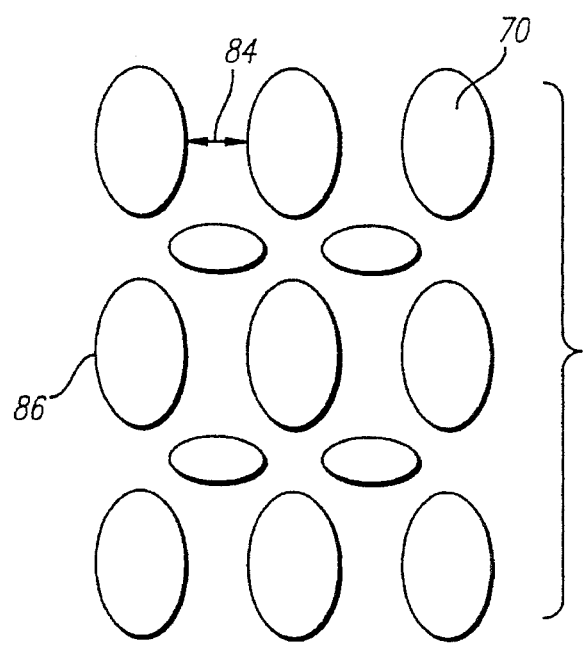
FIG. 5 is an arrangement of microlenses of a conventional solid state image sensor.
Figure 6:
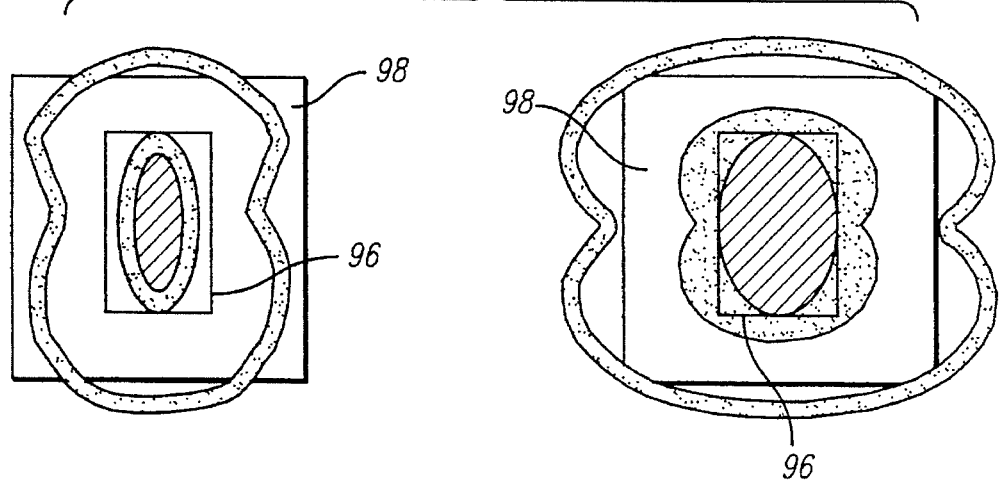
FIG. 6 shows the shape of light focused by a common microlens.
Figure 6A:
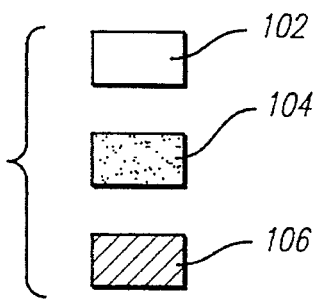
FIG. 6a is the key legend for FIG. 6.

First, the shape of a light reception part 96 of each photodiode PD 90 is formed to have the shape of a peanut shell as shown in FIG. 6 and a plurality of such photodiodes are arranged in diagonal direction, i.e., photodiodes in even number columns and odd number columns are arranged to straddle each other. A unit cell is shown in FIG. 6 by reference numeral 98. FIG. 6a is the key legend for FIG. 6 showing the occupation rate to total quantity of light incident into lens region. Blocks 102, 103, 104, 106 show rates of 35%, 25% and 40%, respectively. A vertical charge coupled device 92 is formed between every column of photodiodes arranged vertically in zigzag for transmitting image signal charges generated in the photodiodes, vertically. And polygates are formed over the vertical charge coupled devices for applying clock signals V$\phi$1 to V$\phi$4, 110, 112, 114, 116 for transmitting image signals. Due to such arrangement of photodiodes, the microlenses are also arranged the same as FIG. 7. That is, since the microlenses are formed over the photodiodes in a one-to-one matching, the microlenses are arranged in the same way.

Operation of a solid image sensor of this invention formed with the foregoing construction is the same as the conventional one. However, because the solid state image sensor of this invention has photodiodes and microlenses arranged not in matrix in rows and columns, but straddling each other between photodiodes in odd number columns and even number columns, empty spaces 118 between microlenses are formed smaller than the empty spaces between conventional microlenses. The fixed space between them is shown by reference numeral 120. Therefore, the fill factor of the microlenses can be increased, which can improve resolution.

Furthermore, because the light reception part of a photodiode is shaped like a peanut shell having a narrower middle part matching to the shape of focusing of a lens, even though photodiodes are formed in the same area as the conventional ones, the light reception efficiency can be improved thereby improving resolution.

What is claimed is:

1. A solid state image sensor comprising:

(a) a plurality of photodiodes arranged such that the photodiodes in odd number columns and the photodiodes in even number columns straddle each other, for generating image signal charges by converting light signals into electrical signals, wherein each of the photodiodes is shaped like a peanut shell having a narrower middle part;

(b) vertical charge coupled devices each formed between the photodiode columns for transmitting the image signal charges generated in each of the photodiodes, vertically; and (c) a plurality of microlenses each arranged matched with each of the plurality of photodiodes over each of the photodiodes.

2. The solid state image sensor as claimed in claim 1, wherein each of the vertical charge coupled devices has an "s" shape.

* * * * *